US010924089B1

(12) United States Patent
Fei et al.

(10) Patent No.: US 10,924,089 B1
(45) Date of Patent: Feb. 16, 2021

(54) COMPARING CIRCUIT AND COMPARING MODULE WITH HYSTERESIS

(71) Applicants: Faraday Technology Corporation, Suzhou (CN); FARADAY TECHNOLOGY CORPORATION, Hsinchu (TW)

(72) Inventors: Xiao-Dong Fei, Hsinchu (TW); Wei Wang, Hsinchu (TW); San-Yueh Huang, Hsinchu (TW)

(73) Assignees: FARADAY TECHNOLOGY CORPORATION, Suzhou (CN); Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 17/010,890

(22) Filed: Sep. 3, 2020

(30) Foreign Application Priority Data

Apr. 26, 2020 (CN) .......................... 202010338247.X (51) Int. Cl.
   *H03K 3/0233* (2006.01)
(52) U.S. Cl.
   CPC ................................ *H03K 3/02337* (2013.01)
(58) Field of Classification Search
   CPC .................................................. H03K 3/02337
   USPC .................................................................... 327/77
   See application file for complete search history.

(56) References Cited

U.S. PATENT DOCUMENTS

| 6,208,187 B1 | 3/2001 | Callahan, Jr. | |
|---|---|---|---|
| 6,268,764 B1* | 7/2001 | Eagar | G05F 3/30 327/143 |
| 2016/0011245 A1* | 1/2016 | Gerber | H03M 1/46 327/77 |
| 2019/0158072 A1* | 5/2019 | Tornila Oliver | H03K 3/0377 |

* cited by examiner

*Primary Examiner* — Tomi Skibinski
(74) *Attorney, Agent, or Firm* — Winston Hsu (57) ABSTRACT

A comparing circuit and a comparing module with hysteresis are provided. The comparing module includes a first resistor, a second resistor, and the comparing circuit, which are electrically connected to each other. A comparison voltage is determined according to an input voltage and the resistances of the first resistor and the second resistor. The comparing circuit includes an input circuit, an eternal circuit, and a coupling module. The coupling module includes a first coupling transistor, a second coupling transistor, a third transistor, and a fourth coupling resistor. Control terminals of the first coupling transistor and the second coupling transistor are selectively electrically connected to either one of a first terminal and a second terminal. The second terminals of the third coupling transistor and the fourth coupling transistor are selectively electrically connected to either one of the first terminal and the second terminal.

20 Claims, 7 Drawing Sheets

COMPARING CIRCUIT AND COMPARING MODULE WITH HYSTERESIS

This application claims the benefit of People's Republic of China application Serial No. 202010338247.X, filed Apr. 26, 2020, the subject matter of which is incorporated herein by reference.

BACKGROUND OF THE INVENTION

Technical Field

The disclosure relates in general to a comparing circuit and a comparing module with hysteresis, and more particularly to a comparing circuit and a comparing module with hysteresis operable in a hysteresis mode and a high gain mode.

Background

Comparing circuits are widely used in electronic components, for example, application of analog-to-digital converter (ADC), clock-recovery circuit, window detector, and Schmitt trigger. A comparing circuit receives an input voltage Vin and a reference voltage Vref to generate an output signal Vo. The output signal Vo indicates which of the input voltage Vin and the reference voltage Vref is greater. For example, if the input voltage Vin is greater than the reference voltage Vref, the output signal Vo is at a high level. On the contrary, if the input voltage Vin is smaller than the reference voltage Vref, the output signal Vo is at a low level.

A basic comparing circuit is easily disturbed with the input voltage Vin to result in an oscillating output signal Vo. To avoid the phenomenon, a comparing circuit with hysteresis is developed. The comparing circuit has the characteristics of high noise tolerance and low sensitivity. Therefore, a small change in the input voltage Vin will not result in a rapid change in the output signal Vo so that the comparing circuit with hysteresis has better noise tolerance. However, the introduced hysteresis voltage Vhys in the conventional comparing circuit is much affected by the reference voltage Vref. When a lower reference voltage Vref is received, the hysteresis voltage Vhys decreases accordingly, so that accuracy of the comparing circuit is adversely affected.

SUMMARY

The disclosure is directed to a comparing circuit and a comparing module operable in a hysteresis mode and a high gain mode. In the hysteresis mode, the comparing circuit and the comparing module can provide the hysteresis voltage, which is not affected by the reference voltage. In the high gain mode, the gain of the comparing circuit and the comparing module can be increased by adjusting the size of the transistors thereof.

According to (a first aspect of) the present disclosure, a comparing circuit with hysteresis is provided. The comparing circuit includes an input circuit, an external circuit, and a coupling module. The input circuit includes a first input transistor and a second input transistor. The first input transistor receives a reference voltage, and the second input transistor receives a comparison voltage. The external circuit includes a first external transistor and a second external transistor. The first external transistor is electrically connected to the first input transistor through a first terminal, and the second external transistor is electrically connected to the second input transistor through a second terminal. The coupling module includes a first current amplification circuit and a second current amplification circuit. The first current amplification circuit includes a first coupling transistor and a second coupling transistor. The first coupling transistor includes a first terminal, a second terminal, and a control terminal, wherein the second terminal of the first coupling transistor is electrically connected to the first terminal, and the control terminal of the first coupling transistor is selectively electrically connected to either one of the first terminal and the second terminal. The second coupling transistor includes a first terminal, a second terminal, and a control terminal, wherein the second terminal of the second coupling transistor is electrically connected to the second terminal, and the control terminal of the second coupling transistor is selectively electrically connected to either one of the first terminal and the second terminal. The second current amplification circuit includes a third coupling transistor and a fourth coupling transistor. The third coupling transistor includes a first terminal, a second terminal, and a control terminal, wherein the second terminal of the third coupling transistor is selectively electrically connected to either one of the first terminal and the second terminal, and the control terminal of the third coupling transistor is electrically connected to the second terminal. The fourth coupling transistor includes a first terminal, a second terminal, and a control terminal, wherein the second terminal of the fourth coupling transistor is selectively electrically connected to either one of the first terminal and the second terminal, and the control terminal of the fourth coupling transistor is electrically connected to the first terminal.

According to (a second aspect of) the present disclosure, a comparing module with hysteresis is provided. The comparing module includes a first resistor, a second resistor, and a comparing circuit electrically connected to each other. The first resistor receives an input voltage, and the second resistor receives a ground voltage. A comparison voltage is determined according to the input voltage, a first resistance of the first resistor, and a second resistance of the second resistor. The comparing circuit includes an input circuit, an external circuit, and a coupling module. The input circuit includes a first input transistor and a second input transistor. The first input transistor receives a reference voltage, and the second input transistor receives the comparison voltage. The external circuit includes a first external transistor and a second external transistor. The first external transistor is electrically connected to the first input transistor through a first terminal, and the second external transistor is electrically connected to the second input transistor through a second terminal. The coupling module includes a first current amplification circuit and a second current amplification circuit. The first current amplification circuit includes a first coupling transistor and a second coupling transistor. The first coupling transistor includes a first terminal, a second terminal, and a control terminal, wherein the second terminal of the first coupling transistor is electrically connected to the first terminal, and the control terminal of the first coupling transistor is selectively electrically connected to either one of the first terminal and the second terminal. The second coupling transistor includes a first terminal, a second terminal, and a control terminal, wherein the second terminal of the second coupling transistor is electrically connected to the second terminal, and the control terminal of the second coupling transistor is selectively electrically connected to either one of the first terminal and the second terminal. The second current amplification circuit includes a third coupling transistor and a fourth coupling transistor. The third coupling transistor includes a first terminal, a second terminal, and a control terminal, wherein the second terminal of the third coupling transistor is selectively electrically connected to either one of the first terminal and the second terminal, and the control terminal of the third coupling transistor is electrically connected to the second terminal. The fourth coupling transistor includes a first terminal, a second terminal, and a control terminal, wherein the second terminal of the fourth coupling transistor is selectively electrically connected to either one of the first terminal and the second terminal, and the control terminal of the fourth coupling transistor is electrically connected to the first terminal.

The above and other aspects of the disclosure will become better understood with regard to the following detailed description of the preferred but non-limiting embodiment(s). The following description is made with reference to the accompanying drawings.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
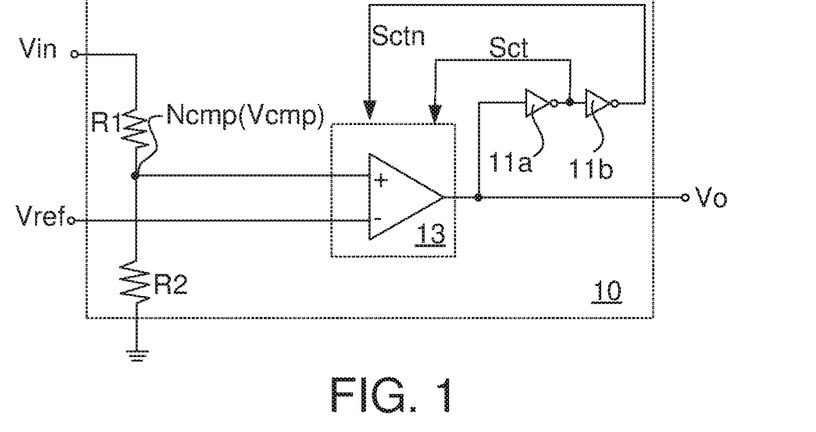
FIG. 1 is a circuit diagram illustrating a comparing module according to an embodiment of the present disclosure.

Please refer to FIG. 1, which is a circuit diagram illustrating a comparing module according to an embodiment of the present disclosure. The comparing module 10 includes resistors R1, R2, and a comparing circuit 13. The comparing circuit 13 has a hysteresis voltage Vhys.

One terminal of the resistor R1 is electrically connected to the input voltage Vin, and the other terminal of the resistor R1 is electrically connected to a comparison terminal Ncmp. One terminal of the resistor R2 is electrically connected to the comparison terminal Ncmp, and the other terminal of the resistor R2 is electrically connected to the ground voltage Gnd. For illustration purposes only, the voltage at the comparison terminal Ncmp is defined as a comparison voltage Vcmp, and the symbols R1 and R2 represent the resistances of the resistors R1 and R2, respectively.

The comparing circuit 13 receives the reference voltage Vref at the inverting terminal and receives the comparison voltage Vcmp at the non-inverting terminal to generate an output signal Vo. The comparing module 10 may further include inverters 11a and 11b. The input terminal of the inverter 11a is electrically connected to the output terminal of the comparing circuit 13, the input terminal of the inverter 11b is electrically connected to the output terminal of the inverter 11a, and the output terminals of both the inverters 11a and 11b are electrically connected to the comparing circuit 13. The output terminal of the inverters 11a and 11b feed control signals Sct and Sctn back to the comparing circuit 13, respectively. Especially, the control signal Sctn and the output signal Vo are in phase, and the control signal Sct and the output signal Vo are in antiphase.

The comparing circuit 13 receives the reference voltage Vref and the comparison voltage Vcmp. Different applications may adopt different reference voltages Vref. In one application, the reference voltage Vref has a preset fixed value, and the comparison voltage Vcmp changes with the input voltage Vin. As shown in FIG. 1, the resistors R1 and R2 are connected in series and the resistor R1 receives the input voltage Vin, and thus the comparison voltage Vcmp could be calculated from the voltage divider rule according to the input voltage Vin and the resistances R1 and R2, that is, the comparison voltage Vcmp=[R2/(R1+R2)]*Vin.

Figure 2A:
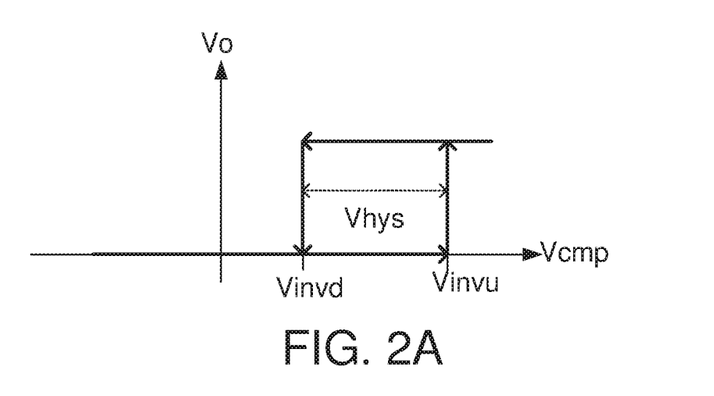
FIG. 2A is a schematic diagram showing the relation between the comparison voltage Vcmp and the output signal Vo of the comparing circuit in FIG. 1.

FIG. 2A is a schematic diagram showing the relation between the comparison voltage Vcmp and the output signal Vo of the comparing circuit in FIG. 1. In this diagram, the vertical axis indicates the output signal Vo and the horizontal axis indicates the comparison voltage Vcmp.

When the comparison voltage Vcmp is equivalent to the reference voltage Vref, the output signal Vo generated by the comparing circuit 13 changes, for example, changing from a low level to a high level or changing from a high level to a low level. At this time, the comparison voltage Vcmp is at a transition point. Two transition points are shown in FIG. 2A, that is, rising transition point and falling transition point corresponding to upward inverse voltage Vinvu and downward inverse voltage Vinvd, respectively.

The change of the output signal Vo in response to an increasing comparison voltage Vcmp starting from 0V is described first. In the beginning, the comparison voltage Vcmp is assumed to be 0V, and the output signal Vo is at a low level. Then, when the comparison voltage Vcmp increases to fall within an open interval between 0V and the upward inverse voltage Vinvu, the output signal Vo retains the low level. Afterward, once the comparison voltage Vcmp reaches the upward inverse voltage Vinvu, the output signal Vo is altered from the low level to a high level immediately. When the comparison voltage Vcmp further increases beyond the upward inverse voltage Vinvu, the output signal Vo retains the high level.

Subsequently, the change of the output signal Vo in response to a decreasing comparison voltage Vcmp starting from the upward inverse voltage Vinvu is described. In the beginning, the comparison voltage Vcmp is assumed to be equivalent to the upward inverse voltage Vinvu, and the output signal Vo is at a high level. Then, when the comparison voltage Vcmp decreases to fall within an open interval between the downward inverse voltage Vinvd and the upward inverse voltage Vinvu, the output signal Vo retains the high level. Afterward, once the comparison voltage Vcmp reaches the downward inverse voltage Vinvd, the output signal Vo is altered from the high level to a low level immediately. When the comparison voltage Vcmp further decreases, the output signal Vo retains the low level. The voltage difference between the upward inverse voltage Vinvu and the downward inverse voltage Vinvd is defined as the hysteresis voltage Vhys.

From the above description, the change of the output signal Vo occurs when the comparison voltage Vcmp and the reference voltage Vref received at the input terminals of the comparing circuit 13 are equivalent to each other. Equation (1) is obtained from Vcmp=[R2/(R1+R2)]*Vin:

$$Vref=Vcmp=[R2/(R1+R2)]*Vin \quad \text{Equation (1)}$$

When the comparison voltage Vcmp is at the transition point, Equation (1) is rearranged to obtain Equation (2):

$$Vin=Vref*[(R1+R2)/R2] \quad \text{Equation (2)}$$

From Equation (2), the transition point of the output signal Vo occurs at Vin=Vref*[(R1+R2)/R2]. Hence, the transition point of the input voltage Vin (Vref*[(R1+R2)/R2]) of the comparing module 10 in FIG. 1 is determined according to the reference voltage Vref and the resistances R1, R2.

Figure 2B:
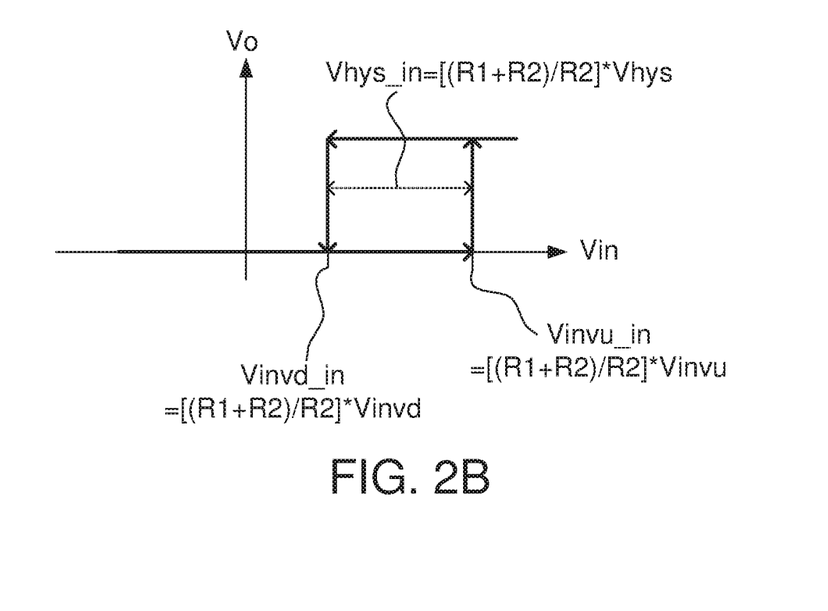
FIG. 2B is a schematic diagram showing the relation between the input voltage Vin and the output signal Vo of the comparing module in FIG. 1.

FIG. 2B is a schematic diagram showing the relation between the input voltage Vin and the output signal Vo of the comparing module in FIG. 1. By rearranging Equation (1) to get the input voltage Vin=(R1+R2)/R2*Vcmp, it shows that the input voltage Vin can be obtained by multiplying the comparison voltage Vcmp by a relative voltage ratio (R1+R2)/R2. Accordingly, the hysteresis loop illustrating the relation between the comparison voltage Vcmp and the output signal Vo in FIG. 2A can be transformed into the hysteresis loop in FIG. 2B illustrating the relation between the comparison voltage Vcmp and the input voltage Vin. The hysteresis voltage Vhys_in, the upward inverse voltage Vinvu_in and the downward inverse voltage Vinvd_in of the input voltage Vin can be obtained by multiplying the corresponding hysteresis voltage Vhys, upward inverse voltage Vinvu and downward inverse voltage Vinvd of the comparison voltage Vcmp by the relative voltage ratio (R1+R2)/R2, respectively.

The comparing circuit 13 is operable in two operation modes wherein one is a hysteresis mode, and the other one is a high gain mode. In this disclosure, Mode 1 denotes the hysteresis mode, and Mode 2 denotes the high gain mode. In the hysteresis mode (Mode 1), the comparing circuit 13 has high noise tolerance for disturbing the comparison voltage Vcmp. In the high gain mode (Mode 2), the comparing circuit 13 provides high gain to generate rapid response to the difference between the comparison voltage Vcmp and the reference voltage Vref.

Figure 3:
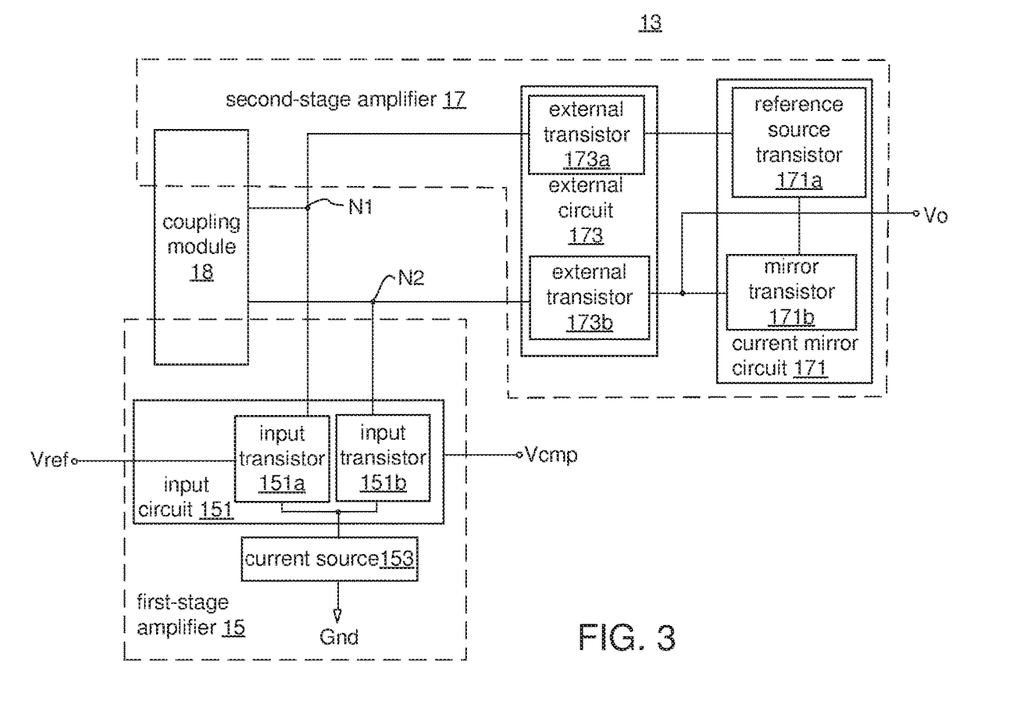
FIG. 3 is a block diagram illustrating a comparing circuit according to an embodiment of the present disclosure.

FIG. 3 is a block diagram illustrating a comparing circuit according to an embodiment of the present disclosure. The comparing circuit 13 includes an input circuit 151, a current source 153, a coupling module 18, an external circuit 173, and a current mirror circuit 171. Further, the comparing circuit 13 is divided into a first-stage amplifier 15 and a second-stage amplifier 17. The first-stage amplifier 15 provides a first gain $A_{VN1}$, and the second-stage amplifier 17 provides a second gain $A_{VN2}$.

The first-stage amplifier 15 includes the input circuit 151, the current source 153, and a portion of the coupling module 18. The input circuit 151 further includes input transistors 151a and 151b. The first-stage amplifier 15 receives the reference voltage Vref through the input transistor 151a and receives the comparison voltage Vcmp through the input transistor 151b. The current source 153 provides a total current to the input circuit 151. The first-stage amplifier 15 generates a first amplifier signal with the first gain $A_{VN1}$ at the terminals N1 and N2.

The second-stage amplifier 17 includes the external circuit 173, the current mirror circuit 171, and the other portion of the coupling module 18. The external circuit 173 further includes external transistors 173a and 173b. The external transistor 173a is electrically connected to the terminal N1, and the external transistor 173b is electrically connected to the terminal N2. The current mirror circuit 171 further includes a reference source transistor 171a and a mirror transistor 171b. The reference source transistor 171a is electrically connected to the external transistor 173a, and the mirror transistor 171b is electrically connected to the external transistor 173b. The second-stage amplifier 17 receives the first amplifier signal through the terminals N1 and N2, and then generates a second amplifier signal with the second gain $A_{VN2}$ as the output signal Vo.

Figure 4:
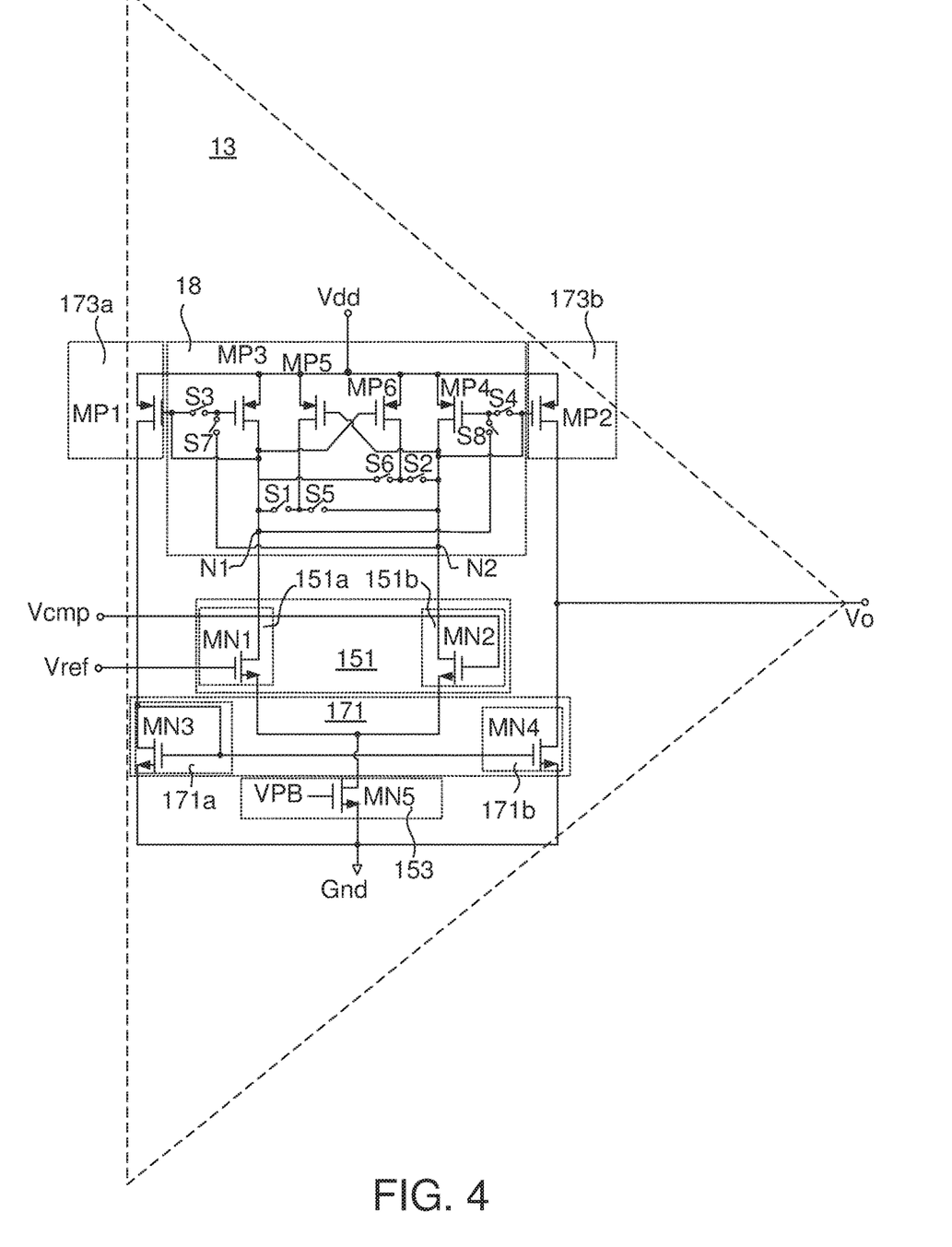
FIG. 4 is a circuit diagram illustrating the internal circuitry of the comparing circuit according to an embodiment of the present disclosure.

FIG. 4 is a circuit diagram illustrating the internal circuitry of the comparing circuit according to an embodiment of the present disclosure. Please refer to both FIGS. 3 and 4 for further description.

The input circuit 151 includes transistors MN1 (input transistor 151a) and MN2 (input transistor 151b). The gate terminal of the transistor MN1 receives the reference voltage Vref, and the gate terminal of the transistor MN2 receives the comparison voltage Vcmp. The drain terminals of the transistors MN1 and MN2 are electrically connected to the coupling module 18 through the terminals N1 and N2, respectively. The source terminals of the transistors MN1 and MN2 are electrically connected to the current source 153.

The current source 153 includes a transistor MN5 of which a source terminal is electrically connected to the ground Gnd, a drain terminal is electrically connected to the source terminals of the transistors MN1 and MN2, and a gate terminal receives a bias voltage VPB. The bias voltage VPB makes the transistor MN5 conducted to provide a total current $I_{mn5}$ continuously.

In the current mirror circuit 171, a transistor MN3 serves as the reference source transistor 171a to provide a reference current $I_{mn3}$, and a transistor MN4 servers as the mirror transistor 171b to generate a mirror current Imn4 corresponding to the reference current $I_{mn3}$. The drain terminal and the gate terminal of the transistor MN3 are electrically connected to each other and further electrically connected to the gate terminal of the transistor MN4. The source terminals of the transistors MN3 and MN4 are electrically connected to the ground voltage Gnd. The drain terminal of the transistor MN3 is electrically connected to the external transistor 173a, and the drain terminal of the transistor MN4 is electrically connected to the external transistor 173b.

The transistors MP1 and MP2 serve as the external transistors 173a and 173b, respectively. The source terminals of the transistors MP1 and MP2 are electrically connected to the supply voltage Vdd. The drain terminal of the transistor MP1 is electrically connected to the drain terminal of the transistor MN3, and the gate terminal of the transistor MP1 is electrically connected to the terminal N1. The drain terminal of the transistor MP2 is electrically connected to the drain terminal of the transistor MN4, and the gate terminal of the transistor MP2 is electrically connected to the terminal N2. In the diagram, the transistors MP1~MP6 are implemented by PMOS transistors, and the transistors MN1~MN6 are implemented by NMOS transistors, but the types of the transistors are not limited to the embodiment and could be selected to meet various requirements.

As shown in FIG. 4, the coupling module 18 includes transistors MP3~MP6 and switches S1~S8. The drain terminals of the transistors MP3~MP6 are electrically connected to the supply voltage Vdd. The coupling relation of the gate terminals and the drain terminals of the transistors MP3~MP6 will change during the operation, and the transistors MP3~MP6 are called coupling transistors in the disclosure. Please refer to Table 1, illustrating the coupling relation of the switches S1~S8.

TABLE 1

| switch | associated terminal | associated transistor |
| --- | --- | --- |
| S1 | N1 | drain terminal of transistor MP5 |
| S2 | N2 | drain terminal of transistor MP6 |
| S3 | N1 | gate terminal of transistor MP3 |
| S4 | N2 | gate terminal of transistor MP4 |
| S5 | N2 | drain terminal of transistor MP5 |
| S6 | N1 | drain terminal of transistor MP6 |
| S7 | N2 | gate terminal of transistor MP3 |
| S8 | N1 | gate terminal of transistor MP4 |

The operations of the transistors MP3~MP6 are respectively explained in the following description to realize the coupling relationship between the transistors MP3~MP6 and the terminals N1 and N2 in response to the switching of the switches S1~S8. Please refer to FIG. 4 and Table 1 together.

The gate terminal of the transistor MP3 is electrically connected to both the switches S3 and S7. When the switch S3 is switched on, the gate terminal of the transistor MP3 is electrically connected to the terminal N1. When the switch S7 is switched on, the gate terminal of the transistor MP3 is electrically connected to the terminal N2. Because the switches S3 and S7 are switched on in turn, the gate terminal of the transistor MP3 is electrically connected to either the terminal N1 or the terminal N2. Furthermore, the drain terminal of the transistor MP3 is directly electrically connected to the terminal N1 without any interposed switch.

The gate terminal of the transistor MP4 is electrically connected to both the switches S8 and S4. When the switch S8 is switched on, the gate terminal of the transistor MP4 is electrically connected to the terminal N1. When the switch S4 is switched on, the gate terminal of the transistor MP4 is electrically connected to the terminal N2. Because the switches S8 and S4 are switched on in turn, the gate terminal of the transistor MP4 is electrically connected to either the terminal N1 or the terminal N2. Furthermore, the drain terminal of the transistor MP4 is directly electrically connected to the terminal N1 without any interposed switch.

The gate terminal of the transistor MP5 is directly electrically connected to the terminal N2 without any interposed switch. Further, the drain terminal of the transistor MP5 is electrically connected to both the switches S1 and S5. When the switch S1 is switched on, the drain terminal of the transistor MP5 is electrically connected to the terminal N1. When the switch S5 is switched on, the drain terminal of the transistor MP5 is electrically connected to the terminal N2. Because the switches S1 and S5 are switched on in turn, the drain terminal of the transistor MP5 is electrically connected to either the terminal N1 or the terminal N2.

The gate terminal of the transistor MP6 is directly electrically connected to the terminal N1 without any interposed switch. Further, the drain terminal of the transistor MP6 is electrically connected to both the switches S6 and S2. When the switch S6 is switched on, the drain terminal of the transistor MP6 is electrically connected to the terminal N1. When the switch S2 is switched on, the drain terminal of the transistor MP6 is electrically connected to the terminal N2. Because the switches S6 and S2 are switched on in turn, the drain terminal of the transistor MP6 is electrically connected to either the terminal N1 or the terminal N2.

According to the above description, the transistors MP3~MP6 are electrically connected to the terminals in two ways. In a first way, the gate terminal has a fixed connection, and the drain terminal is electrically connected to different terminals in different operation modes (that is, the transistors MP5 and MP6). In a second way, the drain terminal has a fixed connection, and the gate terminal is electrically connected to different terminals in different operation modes (that is, the transistors MP3 and MP4). In the disclosure, the transistors are classified according to their current amplification factors. For example, the transistors MP5 and MP6 are defined as high current amplification transistors, and the transistors MP3 and MP4 are defined as low current amplification transistors. Similarly, a combination of the transistors MP5 and MP6 is defined as a high current amplification circuit, and a combination of the transistors MP3 and MP4 is defined as a low current amplification circuit.

According to the present disclosure, the switches S1~S8 are divided into two groups. One group, including the switches S1~S4, is controlled with the control signal Sct, and the other group, including the switches S5~S8, is controlled with the control signal Sctn. Table 2 shows the actions of and associated control signals to the respective switches S1~S8 in different operation modes.

TABLE 2

| | associated control signal | hysteresis mode (Mode 1) | high gain mode (Mode 2) |
| --- | --- | --- | --- |
| switches S1~S4 | control signal Sct | ON | OFF |
| switches S5~S8 | control signal Sctn | OFF | ON |

As shown in FIG. 1, the output signal Vo is inverted by the inverter 11a to generate the control signal Sct, and the control signal Sct is further inverted by the inverter 11b to generate the control signal Sctn. Therefore, the control signal Sct and the output signal Vo are in antiphase, and the control signal Sctn and the output signal Vo are in phase.

As the output signal Vo is at the low level in the hysteresis mode (Mode 1), the control signals Sct and Sctn are at the high level and the low level in the hysteresis mode (Mode 1), respectively. Consequently, the switches S1~S4 being controlled with the control signal Sct are switched on in the hysteresis mode (Mode 1), and the switches S5~S8 controlled with the control signal Sctn are switched off in the hysteresis mode (Mode 1). Thus, the switch S1 makes the terminal N1 electrically connected to the drain terminal of the transistor MP5; the switch S2 makes the terminal N2 electrically connected to the drain terminal of the transistor MP6; the switch S3 makes the terminal N1 electrically connected to the gate terminal of the transistor MP3; and the switch S4 makes the terminal N2 electrically connected to the gate terminal of the transistor MP4.

On the other hand, as the output signal Vo is at the high level in the high gain mode (Mode 2), the control signals Sct and Sctn are at the low level and the high level in the high gain mode (Mode 2), respectively. Consequently, the switches S1~S4 being controlled with the control signal Sct are switched off in the high gain mode (Mode 2), and the switches S5~S8 controlled with the control signal Sctn are switched on in the high gain mode (Mode 2). Thus, the switch S5 makes the terminal N2 electrically connected to the drain terminal of the transistor MP5; the switch S6 makes the terminal N1 electrically connected to the drain terminal of the transistor MP6; the switch S7 makes the terminal N2 electrically connected to the gate terminal of the transistor MP3; and the switch S8 makes the terminal N1 electrically connected to the gate terminal of the transistor MP4.

The properties of respective transistors MN1-MN5 and MP1-MP8 are denoted by symbols with a subscript in lowercase letters. For example, the current flowing through the transistor MP1 is denoted as Imo, the current amplification factor of the transistor MP6 is denoted as $\beta_{mp6}$, the channel width of the transistor MP3 is denoted as $W_{mp3}$, and the channel length of the transistor MP3 is denoted as $L_{mp3}$. Other symbols representing the properties of respective transistors could be derived according to the same principle and are not specified herein.

Figure 5A:
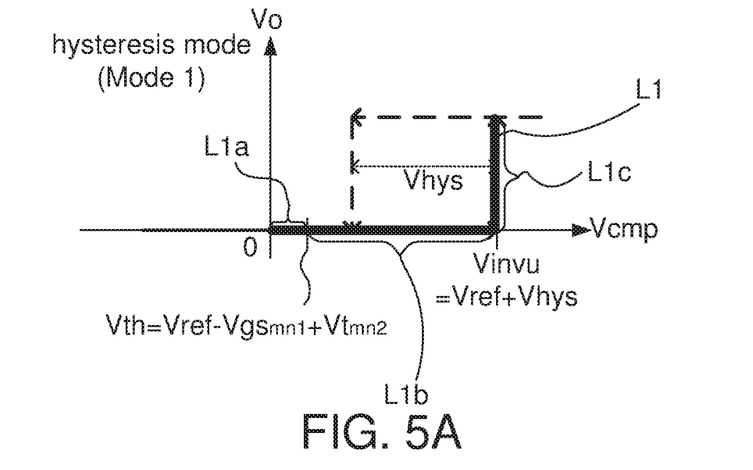
FIG. 5A is a schematic diagram showing the relation between the comparison voltage Vcmp and the output signal Vo of the comparing circuit in the hysteresis mode (Mode 1).

FIG. 5A is a schematic diagram showing the relation between the comparison voltage Vcmp and the output signal Vo of the comparing circuit in the hysteresis mode (Mode 1). The solid line L1 indicates the circuit behavior of the comparing circuit 13 in the hysteresis mode (Mode 1), that is, the process in which the comparison voltage Vcmp increases from 0V to the upward inverse voltage Vinvu. Along the solid line L1, the comparison voltage Vcmp has tiny changes within a small range. The comparing circuit 13 should have better noise tolerance in the hysteresis mode (Mode 1). The solid line L1 includes line segments L1a, L1b, and L1c, which will be described in detail below.

Figure 5B:
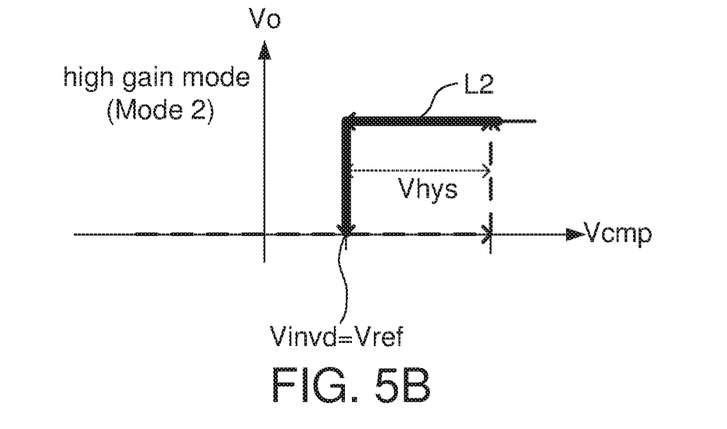
FIG. 5B is a schematic diagram showing the relation between the comparison voltage Vcmp and the output signal Vo of the comparing circuit in the high gain mode (Mode 2).

FIG. 5B is a schematic diagram showing the relation between the comparison voltage Vcmp and the output signal Vo of the comparing circuit in the high gain mode (Mode 2). The solid line L2 indicates the circuit behavior of the comparing circuit 13 in the high gain mode (Mode 2), that is, the process in which the comparison voltage Vcmp deceases from the upward inverse voltage Vinvu to the downward inverse voltage Vinvd. Along the solid line L2, the output signal Vo should present real-time change in the comparison voltage Vcmp. In other words, the comparing circuit 13 is required to generate the output signal Vo in rapid response to the voltage difference between the comparison voltage Vcmp and the reference voltage Vref received at the input terminals. Thus, the comparing circuit 13 should provide a higher gain in the high gain mode (Mode 2).

On the one hand, as shown in FIG. 5A, the comparing circuit 13 needs to maintain the stability of the output signal Vo to prevent fluctuation in the output signal Vo due to small changes in the comparison voltage Vcmp. In the hysteresis mode (Mode 1). On the other hand, as shown in FIG. 5B, the comparing circuit 13 needs to make the output signal Vo respond to the changes in the signals at the input terminals rapidly in the high gain mode (Mode 2).

According to the present disclosure, the design of the coupling module 18 makes the operation of the comparing circuit 13 flexible. Based on the structure, the switches S1~S8 can switch between the hysteresis mode (Mode 1) and the high gain mode (Mode 2). As a consequence of the switching actions of the switches S1~S8, the coupling relation between the transistors MP3~MP6 and the terminals N1 and N2 is adjustable. Therefore, the configuration of the first-stage amplifier 15 and the second-stage amplifier 17 changes with the operation modes.

Figure 6A:
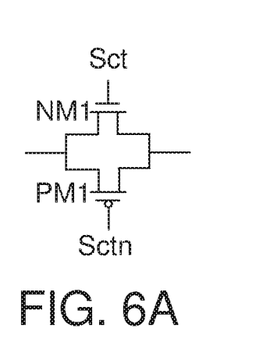
FIG. 6A is a schematic diagram illustrating a transmission gate for implementing the switches S1~S4.

The comparing circuit 13 operated in the hysteresis mode (Mode 1) is described with reference to FIGS. 6A, 6B, 7A, and 7B. FIG. 6A is a schematic diagram illustrating a transmission gate for implementing the switches S1~S4. The transmission gate for implementing each switch S1~S4 includes a PMOS transistor PM1 and an NMOS transistor NM1. The gate terminal of the NMOS transistor NM1 receives the control signal Sct, and the gate terminal of the PMOS transistor PM1 receives the control signal Sctn.

Please refer to both FIGS. 5A and 6A together. As shown in FIG. 5A, as the output signal Vo is at the low level in the hysteresis mode (Mode 1), the control signal Sct is at the high level and the control signal Sctn is at the low level. Therefore, the gate terminal of the NMOS transistor NM1 in FIG. 6A receives the control signal Sct at the high level and the gate terminal of the PMOS transistor PM1 in FIG. 6A receives the control signal Sctn at a low level. As a result, the switches S1~S4 are switched on.

Please refer to both FIGS. 5B and 6A together. As shown in FIG. 5B, as the output signal Vo is at the high level in the high gain mode (Mode 2), the control signal Sct is at the low level and the control signal Sctn is at the high level. Therefore, the gate terminal of the NMOS transistor NM1 in FIG. 6A receives the control signal Sct at the low level and the gate terminal of the PMOS transistor PM1 in FIG. 6A receives the control signal Sctn at a high level. As a result, the switches S1~S4 are switched off.

Figure 6B:
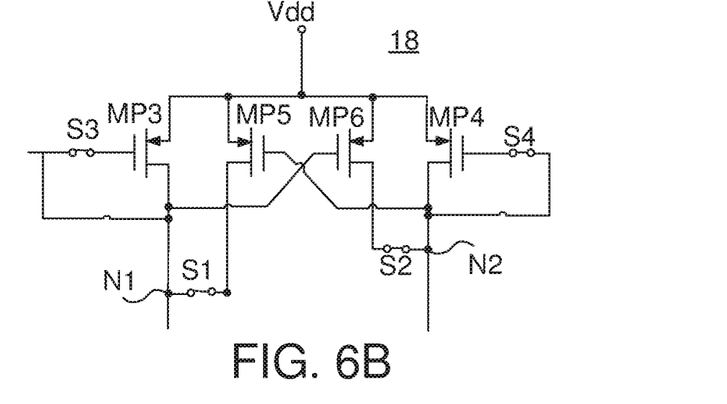
FIG. 6B is a circuit diagram illustrating the internal coupling relation of the coupling module in the hysteresis mode (Mode 1).

FIG. 6B is a circuit diagram illustrating the internal coupling relation of the coupling module in the hysteresis mode (Mode 1). According to the description with reference to FIG. 4, the switches S1~S4 are switched on, and the switches S5~S8 are switched off in the hysteresis mode (Mode 1). For clearly showing the coupling relationship between the transistors, the current paths corresponding to the non-conducted switches S5~S8 are not shown in FIG. 6B. Table 3 shows the coupling relation of the terminals of respective transistors MP3~MP6 in the hysteresis mode (Mode 1).

TABLE 3

| transistor | source | drain | gate |
|---|---|---|---|
| MP3 | supply voltage Vdd | terminal N1 | terminal N1 (switch S3 is ON) |
| MP4 | | terminal N2 | terminal N2 (switch S4 is ON) |
| MP5 | | terminal N1 (switch S1 is ON) | terminal N2 |
| MP6 | | terminal N2 (switch S2 is ON) | terminal N1 |

Please refer to both FIG. 6B, and Table 3. In the hysteresis mode (Mode 1), in the transistor MP3, the source terminal is electrically connected to the supply voltage Vdd, the drain terminal is electrically connected to the terminal N1, and the gate terminal is electrically connected to the terminal N1 through the conducted switch S3; in the transistor MP4, the source terminal is electrically connected to the supply voltage Vdd, the drain terminal is electrically connected to the terminal N2, and the gate terminal is electrically connected to the terminal N2 through the conducted switch S4; in the transistor MP5, the source terminal is electrically connected to the supply voltage Vdd, the drain terminal is electrically connected to the terminal N1 through the conducted switch S1, and the gate terminal is electrically connected to the terminal N2; and in the transistor MP6, the source terminal is electrically connected to the supply voltage Vdd, the drain terminal is electrically connected to the terminal N2 through the conducted switch S2, and the gate terminal is electrically connected to the terminal N1.

Figure 7A:
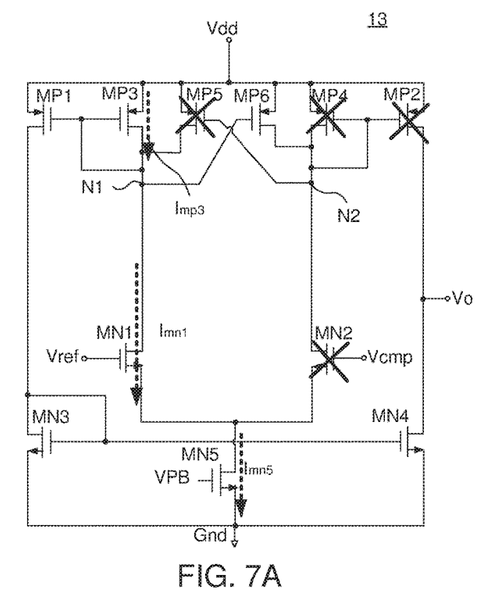
FIGS. 7A and 7B are schematic diagrams showing the current direction in the comparing circuit in the hysteresis mode (Mode 1).
Figure 7B:
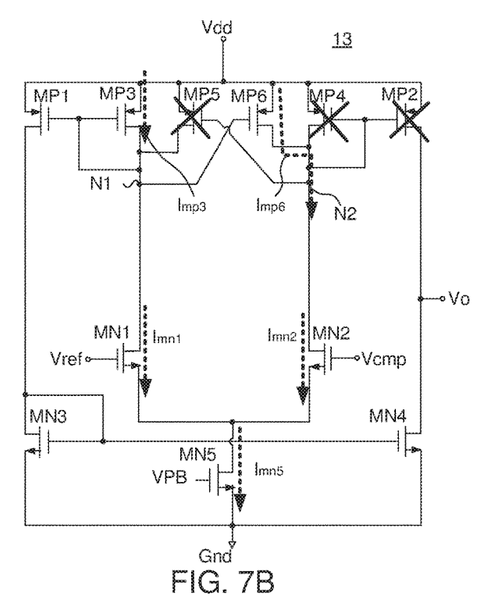

FIGS. 7A and 7B are schematic diagrams showing the current direction in the comparing circuit in the hysteresis mode (Mode 1). In the hysteresis mode (Mode 1), the coupling relationship between the switches S1~S8 and the transistors MP3~MP6 of the coupling module 18 of the comparing circuit 13 has been described with reference to FIG. 6B. To simplify the drawing, the switches S1~S4 are not shown in FIGS. 7A and 7B, and the relative positions of the transistors are rearranged without changing the equivalent circuit.

Please refer to both FIGS. 5A and 7A together. The line segment L1a represents that the comparison voltage Vcmp is smaller than the threshold voltage Vth. At first, the status of the transistors MP3, MP1, and MP6 with gate terminals electrically connected to the terminal N1 is explained. The transistor MN1 is conducted because its gate terminal continuously receives the reference voltage Vref so as to generate the current $I_{mn1}$ flowing through the transistor MN1. The current $I_{mn1}$ lowers the voltage at the terminal N1 and makes the transistors MP3, MP1, and MP6 conducted.

Further, the status of the transistors MP5, MP4, and MP2 with gate terminals electrically connected to the terminal N2 is explained. The transistor MN2 is non-conducted because the comparison voltage Vcmp received at its gate terminal is not great enough to make the transistor MN2 conducted. As a result, the gate terminals of the transistors MP5, MP4, and MP2 electrically connected to the terminal N2 are floating. Thus, the transistors MP5, MP4, and MP2 are non-conducted.

At this time, the transistor MP6 is conducted because its gate terminal receives a low voltage at the terminal N1. However, the drain terminal of the transistor MP6 is electrically connected to the floating terminal N2 so that no current flows through the transistor MP6. As shown in FIG. 7A, the total current $I_{mn5}$ flowing through the transistor MN5, completely comes from the current $I_{mn1}$ flowing through the transistor MN1.

When the comparison voltage Vcmp gradually increases to $Vref-Vgs_{mn1}+Vt_{mn2}$, the transistor MN2 becomes conducted. The threshold voltage for conducting the transistor MN2 is represented as $Vt_{mn2}$. Therefore, the threshold voltage Vth in FIG. 7A is defined as $Vth=Vref-Vgs_{mn1}+Vt_{mn2}$.

Please refer to both FIGS. 5A and 7B together. The line segment L1b represents that the comparison voltage Vcmp increases from the threshold voltage Vth to slightly smaller than the upward inverse voltage Vinvu.

At first, the status of the transistors MP3, MP1, and MP6 with gate terminals electrically connected to the terminal N1 is explained. The transistor MN1 is conducted because its gate terminal continuously receives the reference voltage Vref so as to generate the current $I_{mn1}$ flowing through the transistor MN1. The current $I_{mn1}$ lowers the voltage at the terminal N1 and makes the transistors MP3, MP1, and MP6 conducted. At this time, the current $I_{mn1}$ flowing through the transistor MN1 is equivalent to the current $I_{mp3}$ flowing through the transistor MP3.

Further, the status of the transistors MP5, MP4, and MP2 with gate terminals electrically connected to the terminal N2 is explained. The transistor MN2 is conducted because the comparison voltage Vcmp received at its gate terminal is great enough to make the transistor MN2 conducted. At this time, the current $I_{mp6}$ flowing through the transistor MP6 raises the voltage at the terminal N2, and the transistors MP5, MP4, and MP2 are remained non-conducted. The current $I_{mp6}$ flowing through the transistor MP6 further flows through the transistor MN2 to form the current $I_{mn2}$, that is, $I_{mp6}=I_{mn2}$.

As shown in FIG. 7B, the total current $I_{mn5}$ flowing through the transistor MN5 comes from the current $I_{mn1}$ flowing through the transistor MN1 and the current $I_{mn2}$ flowing through the transistor $I_{mn2}$. Further, the current $I_{mn1}$ flowing through the transistor MN1 is equivalent to the current $I_{mp3}$ flowing through the transistor MP3, that is, $I_{mn1}=I_{mp3}$ because the transistor MP5 is non-conducted. Also, the current $I_{mn2}$ flowing through the transistor MN2 is equivalent to the current $I_{mp6}$ flowing through the transistor MP6, that is, $I_{mn2}=I_{mp6}$ because the transistor MP4 is non-conducted. The relationship between the current $I_{mp6}$ flowing through the transistor MP6 and the current $I_{mp3}$ flowing through the transistor MP3 can be expressed by the current amplification factor $\beta_{mp6}$ of the transistor MP6 and the current amplification factor $\beta_{mp3}$ of the transistor MP3 as $I_{mp6}<(\beta_{mp6}/\beta_{mp3})*I_{mp3}$.

Please refer to both FIGS. 5A and 7B together. The line segment L1c represents that the comparison voltage Vcmp reaches the upward inverse voltage Vinvu. The current $I_{mp6}$ flowing through the transistor MP6 further increases. The relationship between the current $I_{mp6}$ flowing through the transistor MP6 and the current $I_{mp3}$ flowing through the transistor MP3 is $I_{mp6}=(\beta_{mp6}/\beta_{mp3})*I_{mp3}$.

Hence, the relationship of the currents along the line segment L1c is shown in the following Equations (3)-(6).

$$I_{mn1}=I_{mp3} \quad \text{Equation (3)}$$

$$I_{mn2}=I_{mp6} \quad \text{Equation (4)}$$

$$I_{mp6}=(\beta_{mp6}/\beta_{mp3})*I_{mp3}=[(W_{mp6}/L_{mp6})/(W_{mp3}/L_{mp3})]*I_{mp3} \quad \text{Equation (5)}$$

$$I_{mn2}=I_{mn5}-I_{mn1} \quad \text{Equation (6)}$$

As shown in FIG. 7B, the reference voltage Vref is the sum of the voltage difference $Vgs_{mn1}$ between the gate terminal and the source terminal of the transistor MN1 and the voltage difference $Vds_{mn5}$ between the drain terminal and the source terminal of the transistor MN5, as expressed in Equation (7):

$$Vref=Vgs_{mn1}+Vds_{mn5} \quad \text{Equation (7)}$$

Further, as shown in FIG. 7B, the comparison voltage Vcmp is the sum of the voltage difference $Vgs_{mn2}$ between the gate terminal and the source terminal of the transistor MN2 and the voltage difference Vds$_{mn5}$ between the drain terminal and the source terminal of the transistor MN5, as expressed in Equation (8):

$$V\text{cmp} = Vgs_{mn2} + Vds_{mn5} \quad \text{Equation (8)}$$

Further, at the rising transition point, the comparison voltage Vcmp is equivalent to the sum of the reference voltage Vref and the hysteresis voltage Vhys, as expressed in Equation (9):

$$V\text{cmp} = V\text{ref} + V\text{hys} \quad \text{Equation (9)}$$

Equation (8) and Equation (9) are combined to obtain Equation (10).

$$V\text{cmp} = V\text{ref} + V\text{hys} = Vgs_{mn2} + Vds_{mn5} \quad \text{Equation (10)}$$

Form Equation (10), the hysteresis voltage Vhys is the difference between the voltage difference Vgs$_{mn2}$ between the gate terminal and the source terminal of the transistor MN2 and the voltage difference Vgs$_{mn1}$ between the gate terminal and the source terminal of the transistor MN1, as expressed in Equation (11).

$$V\text{hys} = Vgs_{mn2} + Vds_{mn5} - V\text{ref}$$

$$= Vgs_{mn2} + Vds_{mn5} - (Vgs_{mn1} + Vds_{mn5})$$

$$= Vgs_{mn2} - Vgs_{mn1} \quad \text{Equation (11)}$$

According to the behavior of the transistor, the current I$_{mn2}$ flowing through the transistor MN2 can be expressed by the voltage difference Vgs$_{mn2}$ between the gate terminal and the source terminal of the transistor MN2 and the current amplification factor β$_{mn2}$ of the transistor MN2, that is, $$I_{mn2} = \frac{1}{2} * \beta^*_{mn2} Vgs^2_{mn2},$$

so that Equation (12) is obtained:

$$Vgs_{mn2} = \sqrt{\frac{2 * I_{mn2}}{\beta_{mn2}}} \quad \text{Equation (12)}$$

Similarly, the current I$_{mn1}$ flowing through the transistor MN1 can be expressed by the voltage difference Vgs$_{mn1}$ between the gate terminal and the source terminal of the transistor MN1 and the current amplification factor β$_{mn1}$ of the transistor MN1, that is, $$I_{mn1} = \frac{1}{2} * \beta^*_{mn1} Vgs^2_{mn1},$$

so that Equation (13) is obtained:

$$Vgs_{mn1} = \sqrt{\frac{2 * I_{mn1}}{\beta_{mn1}}} \quad \text{Equation (13)}$$

Equation (12) and Equation (13) are substituted into Equation (11) to obtain the hysteresis voltage Vhys:

$$V\text{hys} = \sqrt{\frac{2 * I_{mn1}}{\beta_{mn2}}} - \sqrt{\frac{2 * I_{mn1}}{\beta_{mn1}}} \quad \text{Equation (14)}$$

From Equation (14), it is realized the hysteresis voltage Vhys of the comparing circuit 13 only depends on the current amplification factor β$_{mn1}$ of the transistor MN1, the current amplification factor β$_{mn2}$ of the transistor MN2, the current I$_{mn1}$ flowing through the transistor MN1, and the current I$_{mn2}$ flowing through the transistor MN2. Therefore, the hysteresis voltage Vhys does not vary with the reference voltage Vref.

According to the above description, the transistors MP5, MP4, and MP2 are non-conducted, and the transistors MN1, MP1, MP3, MP6, MN3, MN4, and MN5 are conducted in the hysteresis mode (Mode 1). Further, the transistor MN2 is non-conducted when the comparison voltage Vcmp is smaller than the threshold voltage Vth (that is, Vcmp<Vth). Otherwise, the transistor MN2 is conducted when the comparison voltage Vcmp is greater than or equivalent to the threshold voltage Vth (that is, Vcmp≥Vth).

Figure 8A:
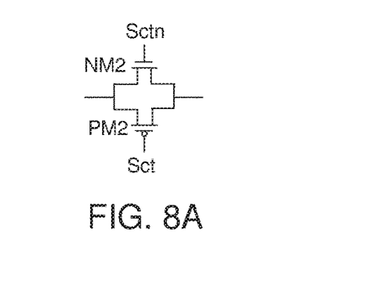
FIG. 8A is a schematic diagram illustrating a transmission gate for implementing the switches S5-S8.

Subsequently, the comparing circuit 13 operated in the high gain mode (Mode 2) is described with reference to FIGS. 8A, 8B, and 9. FIG. 8A is a schematic diagram illustrating a transmission gate for implementing the switches S5~S8. The transmission gate for implementing each switch S5~S8 includes a PMOS transistor PM2 and an NMOS transistor NM2. The gate terminal of the NMOS transistor NM2 receives the control signal Sctn, and the gate terminal of the PMOS transistor PM2 receives the control signal Sct.

Please refer to both FIGS. 5A and 8A together. As shown in FIG. 5A, as the output signal Vo is at the low level in the hysteresis mode (Mode 1), the control signal Sct is at the high level and the control signal Sctn is at the low level. Therefore, the gate terminal of the NMOS transistor NM2 in FIG. 8A receives the control signal Sctn at the low level and the gate terminal of the PMOS transistor PM2 in FIG. 8A receives the control signal Sct at the high level, as shown in FIG. 8A. As a result, the switches S5~S8 are switched off in the hysteresis mode (Mode 1).

Please refer to both FIGS. 5B and 8A together. As shown in FIG. 5B, as the output signal Vo is at the high level in the high gain mode (Mode 2), the control signal Sct is at the low level and the control signal Sctn is at the high level. Therefore, in FIG. 8A, the gate terminal of the NMOS transistor NM2 receives the control signal Sctn at the high level, and the gate terminal of the PMOS transistor PM2 receives the control signal Sct at a low level. As a result, the switches S5~S8 are switched on in the high gain mode (Mode 2).

Figure 8B:
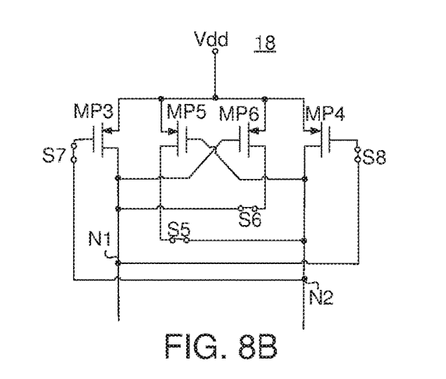
FIG. 8B is a circuit diagram illustrating the internal coupling relation of the coupling module in the high gain mode (Mode 2).

FIG. 8B is a circuit diagram illustrating the internal coupling relation of the coupling module in the high gain mode (Mode 2). According to the above description, the switches S1~S4 are switched off, and the switches S5~S8 are switched on in the high gain mode (Mode 2). For clearly showing the coupling relationship between the transistors, the current paths corresponding to the non-conducted switches S1~S4 are not shown in FIG. 8B. Table 4 shows the coupling relation of the terminals of respective transistors MP3~MP6 in the high gain mode (Mode 2).

TABLE 4

| transistor | source | drain | gate |
| --- | --- | --- | --- |
| MP3 | supply voltage Vdd | terminal N1 | terminal N2 (switch S7 is ON) |
| MP4 | | terminal N2 | terminal N1 (switch S8 is ON) |
| MP5 | | terminal N2 (switch S5 is ON) | terminal N2 |
| MP6 | | terminal N1 (switch S6 is ON) | terminal N1 |

Please refer to both FIG. 8B, and Table 4. In the high gain mode (Mode 2), in the transistor MP3, the source terminal is electrically connected to the supply voltage Vdd, the drain terminal is electrically connected to the terminal N1, and the gate terminal is electrically connected to the terminal N2 through the conducted switch S7; in the transistor MP4, the source terminal is electrically connected to the supply voltage Vdd, the drain terminal is electrically connected to the terminal N2, and the gate terminal is electrically connected to the terminal N1 through the conducted switch S8; in the transistor MP5, the source terminal is electrically connected to the supply voltage Vdd, the drain terminal is electrically connected to the terminal N2 through the conducted switch S5, and the gate terminal is electrically connected to the terminal N2; and in the transistor MP6, the source terminal is electrically connected to the supply voltage Vdd, the drain terminal is electrically connected to the terminal N1 through the conducted switch S6, and the gate terminal is electrically connected to the terminal N1.

Figure 9:
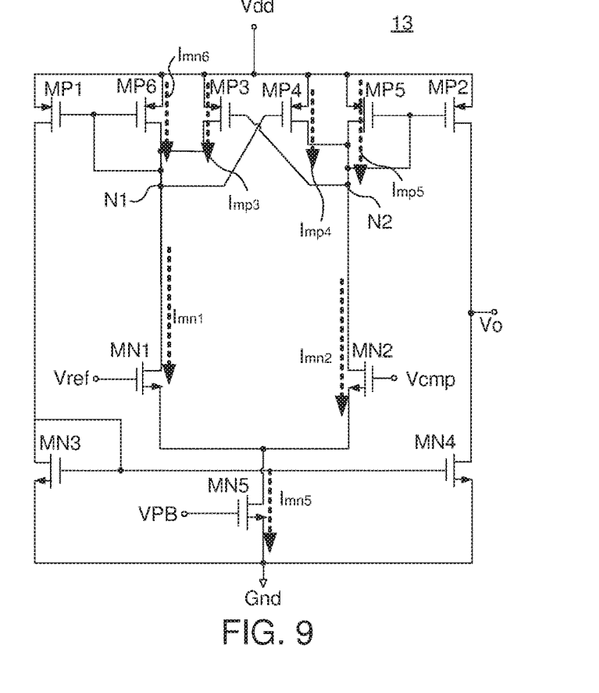
FIG. 9 is a schematic diagram showing the current direction in the comparing circuit in the high gain mode (Mode 2).

FIG. 9 is a schematic diagram showing the current direction in the comparing circuit in the high gain mode (Mode 2). In the high gain mode (Mode 2), the coupling relationship between the switches S1~S8 and the transistors MP3~MP6 of the coupling module 18 of the comparing circuit 13 has been described with reference to FIG. 6B. To simplify the drawing, the switches S5~S8 in FIG. 8B are not shown in FIG. 9, and the relative positions of the transistors are rearranged without changing the equivalent circuit. At this time, the transistors MP3 and MP4 are conducted, and the current $I_{mp3}$ flowing through the transistor MP3 and the current Imo flowing through the transistor MP4 are formed.

The relationship between the currents in FIG. 9 is indicated herein. The current $I_{mn1}$ flowing through the transistor MN1 is the sum of the current $I_{mp3}$ flowing through the transistor MP3 and the current $I_{mp6}$ flowing through the transistor MP6 (that is, $I_{mn1}=I_{mp3}+I_{mp6}$); the current $I_{mn2}$ flowing through the transistor MN2 is the sum of the current $I_{mp4}$ flowing through the transistor MP4 and the current $I_{mp5}$ flowing through the transistor MP5 (that is, $I_{mn2}=I_{mp4}+I_{mp5}$); and the current $I_{mn5}$ flowing through the transistor MN5 is the sum of the current $I_{mn1}$ flowing through the transistor MN1 and the current $I_{mn2}$ flowing through the transistor MN2 (that is, $I_{mn5}=I_{mn1}+I_{mn2}$).

As shown in FIG. 9, the transistors MP5, MP6, MP1, MP2, MN3, and MN4 collectively form the second-stage amplifier 17, which generates the output signal Vo according to the voltages at the terminals N1 and N2. The second gain $A_{VN2}$ provided by the second-stage amplifier 17 is determined according to the transconductance $gm_{mp2}$ of the transistor MP2, the conductance (inverse quantity of resistance) $gds_{mp2}$ between the source terminal and the drain terminal of the transistor MP2, and the conductance $gds_{mn4}$ between the source terminal and the drain terminal of the transistor MN4.

$$A_{VN2} = gm*r_o = gm_{mp2} * \frac{1}{gds_{mp2} + gds_{mn4}} \quad \text{Equation (15)}$$

Further, the transistors MN1, MN2, MP3, and MP4 collectively form the first-stage amplifier 15, which determines the voltages at the terminals N1 and N2 according to the reference voltage Vref and the comparison voltage Vcmp. The first gain $A_{VN1}$ provided by the first-stage amplifier 15 is determined according to the transconductance $gm_{mn2}$ of the transistor MN2, the transconductance $gm_{mp5}$ of the transistor MP5 and the transconductance $gm_{mp4}$ of the transistor MP4.

$$A_{VN1} = gm*r_o = gm_{mn2} * \frac{1}{gm_{mp5} - gm_{mp4}} \quad \text{Equation (16)}$$

$$= \left(gm_{mn2} * \frac{1}{gm_{mp5}}\right) * \frac{1}{1 - \frac{gm_{mp4}}{gm_{mp5}}}$$

Further, the ratio of the transconductances of the transistors is equivalent to the ratio of the current amplification factor of the transistors, that is, $$\frac{gm_{mp4}}{gm_{mp5}} = \frac{\beta_{mp4}}{\beta_{mp5}}.$$

Thus, the first gain $A_{VN1}$ in Equation (16) is expressed as Equation (17):

$$A_{VN1} = \left(gm_{mn2} * \frac{1}{gm_{mp5}}\right) * \frac{1}{1 - \frac{\beta_{mp4}}{\beta_{mp5}}} \quad \text{Equation (17)}$$

The first gain $A_{VN1}$ in Equation (17) and the second gain $A_{VN2}$ in Equation (15) can be used to calculate the gain $A_{VN}$ of the comparing circuit 13 in the high gain mode (Mode 2). The gain $A_{VN}$ of the comparing circuit 13 in the high gain mode (Mode 2) is the product of the first gain $A_{VN1}$ and the second gain $A_{VN2}$ to obtain Equation (18):

$$A_{VN} = A_{VN1}^* A_{VN2} \quad \text{Equation (18)}$$

$$= \left(gm_{mn2} * \frac{1}{gm_{mp5}}\right) *$$

$$\frac{1}{1 - \frac{\beta_{mp4}}{\beta_{mp5}}} * \left(gm_{mp2} * \frac{1}{gds_{mp2} + gds_{mn4}}\right)$$

$$= \frac{1}{1 - \frac{\beta_{mp4}}{\beta_{mp5}}} * \left(gm_{mn2} * gm_{mp2} * \frac{1}{gds_{mp2} + gds_{mn4}} * \frac{1}{gm_{mp5}}\right)$$

From Equation (18), a gain factor $$C = \frac{1}{1 - \frac{\beta_{mp4}}{\beta_{mp5}}}$$

is introduced to calculate the gain $A_{VN}$. The gain effect can be increased by selecting proper current amplification factors $\beta_{mp4}$ and $\beta_{mp5}$ to increase the gain factor C. For example, the ratio $\beta_{mp4}/\beta_{mp5}$ is 3/4 corresponding to a gain $A_{VN}$ of 4.

From the description with reference to FIG. 9, it is realized that when the current amplification factor $\beta_{mp4}$ of the transistor MP4 is smaller than the current amplification factor $\beta_{mp5}$ of the transistor MP5, that is, $\beta_{mp4}<\beta_{mp5}$, the gain $A_{VN}$ of the comparing circuit 13 is raised. For example, the gain $A_{VN}$ of the comparing circuit 13 in the high gain mode (Mode 2) is raised by adopting the transistors MP3 and MP4 with lower current amplification factors in the first-stage amplifier 15 and adopting the transistors MP5 and MP6 with higher current amplification factors in the second-stage amplifier 17.

Please refer to Table 5, which collects the coupling relation of the terminals of respective transistors in the coupling module 18 in different operation modes. The relative details have been given in the previous description and are not further described.

TABLE 5

| transistor | terminal | coupling relation | |
|---|---|---|---|
| MP3 | source | supply voltage Vdd | |
| | drain | terminal N1 | |
| | gate | Mode 1 | terminal N1 (switch S3 is ON) |
| | | Mode 2 | terminal N2 (switch S7 is ON) |
| MP4 | source | supply voltage Vdd | |
| | drain | terminal N2 | |
| | gate | Mode 1 | Terminal N2 (switch S4 is ON) |
| | | Mode 2 | Terminal N1 (switch S8 is ON) |
| MP5 | source | supply voltage Vdd | |
| | drain | Mode 1 | terminal N1 (switch S1 is ON) |
| | | Mode 2 | terminal N2 (switch S5 is ON) |
| | gate | Terminal N2 | |
| MP6 | source | supply voltage Vdd | |
| | drain | Mode 1 | terminal N2 (switch S2 is ON) |
| | | Mode 2 | terminal N1 (switch S6 is ON) |
| | gate | terminal N1 | |

Figure 10:
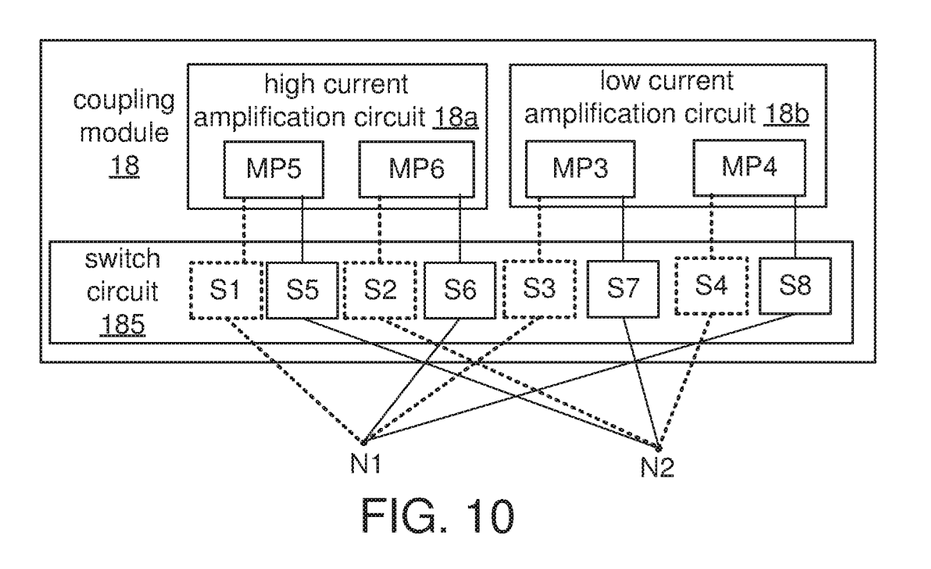
FIG. 10 is a schematic diagram illustrating the transistors involved in the coupling module.

FIG. 10 is a schematic diagram illustrating the transistors involved in the coupling module. As shown in FIG. 10, the coupling module 18 includes a switch circuit 185, the high current amplification circuit 18a, and the low current amplification circuit 18b. The switch circuit 185 includes the switches S1~S8. The high current amplification circuit 18a includes the transistors MP5 and MP6. The low current amplification circuit 18b includes the transistors MP3 and MP4. According to the present disclosure, the current amplification factors $\beta_{mp3}$, $\beta_{mp4}$, $\beta_{mp5}$ and $\beta_{mp6}$ of the transistors MP3, MP4, MP5, and MP6 have the relationship of: $\beta_{mp6}=\beta_{mp5}>\beta_{mp4}=\beta_{mp3}$.

In FIG. 10, the dotted lines indicate the coupling relation in the hysteresis mode (Mode 1). The switches S1~S4 are switched on in the hysteresis mode (Mode 1) and are surrounded with dotted squares. On the other hand, the solid lines indicate the coupling relation in the high gain mode (Mode 2). The switches S5~S8 are switched on in the high gain mode (Mode 2) and are surrounded with solid squares.

Please refer to both FIGS. 6B and 10 together, in the hysteresis mode (Mode 1), the terminal N1 is electrically connected to the drain terminal of the transistor MP5 through the switch S1 and is electrically connected to the gate terminal of the transistor MP3 through the switch S3. On the other hand, the terminal N2 is electrically connected to the drain terminal of the transistor MP6 through the switch S2, and is electrically connected to the gate terminal of the transistor MP4 through the switch S4.

Please refer to both FIGS. 9 and 10 together. In the high gain mode (Mode 2), the terminal N1 is electrically connected to the drain terminal of the transistor MP6 through the switch S6 and is electrically connected to the gate terminal of the transistor MP4 through the switch S8. On the other hand, the terminal N2 is electrically connected to the drain terminal of the transistor MP5 through the switch S5 and is electrically connected to the gate terminal of the transistor MP3 through the switch S7.

To sum up, in the transistors MP5 and MP6, the gate terminals have fixing connection and the drain terminals are electrically connected to the terminals N2 and N1, respectively, which are exchanged in different operation modes. For example, the drain terminal of the transistor MP5 is electrically connected to the terminal N1 in the hysteresis mode (Mode 1) and is switched to be electrically connected to the terminal N2 in the high gain mode (Mode 2). Further, the drain terminal of the transistor MP6 is electrically connected to the terminal N2 in the hysteresis mode (Mode 1), and is switched to be electrically connected to the terminal N1 in the high gain mode (Mode 2).

On the other hand, in the transistors MP3 and MP4, the drain terminals have fixing connections and the gate terminals are electrically connected to the terminals N2 and N1, respectively, which are exchanged in different operation modes. For example, the gate terminal of the transistor MP3 is electrically connected to the terminal N1 in the hysteresis mode (Mode 1) and is switched to be electrically connected to the terminal N2 in the high gain mode (Mode 2). Further, the gate terminal of the transistor MP4 is electrically connected to the terminal N2 in the hysteresis mode (Mode 1) and is switched to be electrically connected to the terminal N1 in the high gain mode (Mode 2).

As shown in FIG. 3, one portion of the coupling module 18 belongs to the first-stage amplifier 15, and the other portion belongs to the second-stage amplifier 17. As shown in FIG. 10, the coupling module 18 includes the switch circuit 185, the high current amplification circuit 18a, and the low current amplification circuit 18b. In the disclosure, each element in the coupling module 18, for example, the switches S1~S8 and the transistors MP3~MP6, is not corresponding to a fixed one of the first-stage amplifier 15 and the second-stage amplifier 17. The association between the elements and the amplifiers 15 and 17 changes as the comparing circuit 13 is operated in different modes. The following description with reference to FIG. 11 explains the association between the elements of the coupling module 18 (for example, the switches S1~S8 and the transistors MP3~MP6) and the first-stage amplifier 15 or the second-stage amplifier 17.

Figure 11:
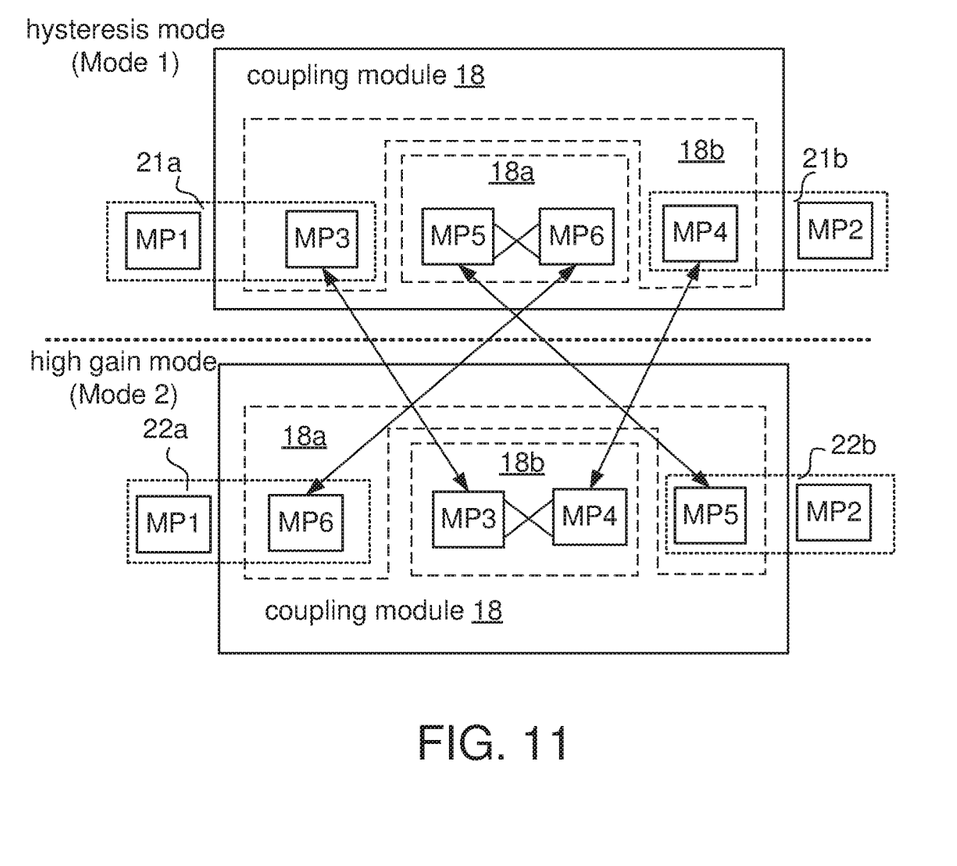
FIG. 11 is a schematic diagram illustrating the dynamically adjusted coupling relation among the transistors of the coupling module of the comparing circuit in different operation modes.

FIG. 11 is a schematic diagram illustrating the dynamically adjusted coupling relation among the transistors of the coupling module of the comparing circuit in different operation modes. The upper part of FIG. 11 shows the arrangement of the transistors of the coupling module 18 in the hysteresis mode (Mode 1). The arrangement of the transistors MP3~MP6 shown on the upper part of FIG. 11 is obtained by simplifying the circuits in FIGS. 7A and 7B. The lower part of FIG. 11 shows the arrangement of the transistors of the coupling module 18 in the high gain mode (Mode 2). The arrangement of the transistors MP3~MP6 shown on the lower part of FIG. 11 is obtained by simplifying the circuits in FIG. 9.

Table 6 shows that the transistors in the high current amplification circuit 18a and the low current amplification circuit 18b of the comparing circuit 13 are cross-coupled or coupled to the transistor MP1 or MP2 to form the external current mirror in corresponding modes.

TABLE 6

|  | high amplification circuit | low amplification circuit |
|---|---|---|
| transistor | MP5, MP6 | MP3, MP4 |
| current amplification factor | high | low |
| Mode1 | cross-coupled | forming external current mirrors with MP1, MP2, respectively |
|  | belonging to first-stage amplifier | belonging to second-stage amplifier |
| Mode2 | forming external current mirrors with MP2 and MP1, respectively | cross-coupled |
|  | belonging to second-stage amplifier | belonging to first-stage amplifier |

In the hysteresis mode (Mode 1), the transistors MP5 and MP6 of the high current amplification circuit 18a are cross-coupled. At this time, the transistors MP3 and MP4 of the low current amplification circuit 18a are electrically connected to the transistors MP1 and MP2 to form the external current mirrors 21a and 21b, respectively. Accordingly, the high current amplification circuit 18a belongs to the first-stage amplifier 15, while the low current amplification circuit 18b belongs to the second-stage amplifier 17 in the hysteresis mode (Mode 1).

In the high gain mode (Mode 2), the transistors MP3 and MP4 of the low current amplification circuit 18b are cross-coupled. At this time, the transistors MP5 and MP6 of the high current amplification circuit 18a are electrically connected to the transistors MP2 and MP1 to form the external current mirrors 22b and 22a, respectively. Accordingly, the low current amplification circuit 18b belongs to the first-stage amplifier 15, while the high current amplification circuit 18a belongs to the second-stage amplifier 17 in the high gain mode (Mode 2).

According to the present disclosure, the comparing circuit 13 has a symmetric structure advantageous to circuit layout with a lower mismatch. Further, the present disclosure considers both hysteresis and gain of the comparing circuit 13 without increasing power consumption and circuit area.

To sum up, the present disclosure disposes of a specific switch circuit in the comparing circuit. The switch circuit can dynamically adjust the coupling relation among the transistors of the comparing circuit in response to different operation modes. Each of the first-stage amplifier and the second-stage amplifier of the comparing circuit has different circuit arrangements in different operation modes.

In the comparing circuit of the present disclosure, the hysteresis voltage Vhys depends only on the sizes of the transistors MN1, MN2, MN3, and MN6, the current $I_{mn1}$ flowing through the transistor MN1 and the current $I_{mn2}$ flowing through the transistor MN2. The hysteresis voltage Vhys is not affected by the reference voltage Vref. Further, the comparing circuit of the present disclosure can provide a higher gain in the high gain mode (Mode 2).

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A comparing circuit with hysteresis, comprising:
   an input circuit, comprising:
      a first input transistor, configured for receiving a reference voltage; and
      a second input transistor, configured for receiving a comparison voltage;
   an external circuit, comprising:
      a first external transistor, electrically connected to the first input transistor through a first terminal; and
      a second external transistor, electrically connected to the second input transistor through a second terminal; and
   a coupling module, comprising:
      a first current amplification circuit, comprising:
         a first coupling transistor having a first terminal, a second terminal and a control terminal, wherein the second terminal of the first coupling transistor is electrically connected to the first terminal, and the control terminal of the first coupling transistor is selectively electrically connected to either one of the first terminal and the second terminal; and
         a second coupling transistor having a first terminal, a second terminal and a control terminal, wherein the second terminal of the second coupling transistor is electrically connected to the second terminal, and the control terminal of the second coupling transistor is selectively electrically connected to either one of the first terminal and the second terminal; and
      a second current amplification circuit, comprising:
         a third coupling transistor having a first terminal, a second terminal and a control terminal, wherein the second terminal of the third coupling transistor is selectively electrically connected to either one of the first terminal and the second terminal, and the control terminal of the third coupling transistor is electrically connected to the second terminal; and
         a fourth coupling transistor having a first terminal, a second terminal and a control terminal, wherein the second terminal of the fourth coupling transistor is selectively electrically connected to either one of the first terminal and the second terminal, and the control terminal of the fourth coupling transistor is electrically connected to the first terminal.

2. The comparing circuit according to claim 1, wherein when the comparing circuit is in a first mode,
   the control terminal of the first coupling transistor is electrically connected to the first terminal;
   the control terminal of the second coupling transistor is electrically connected to the second terminal;

the second terminal of the third coupling transistor is electrically connected to the first terminal; and
the second terminal of the fourth coupling transistor is electrically connected to the second terminal.

3. The comparing circuit according to claim 2, wherein the coupling module further comprises:
   a first switch, electrically connected to the second terminal of the third coupling transistor and the first terminal;
   a second switch, electrically connected to the second terminal of the fourth coupling transistor and the second terminal;
   a third switch, electrically connected to the control terminal of the first coupling transistor and the first terminal; and
   a fourth switch, electrically connected to the control terminal of the second coupling transistor and the second terminal,
   wherein the first, the second, the third, and the fourth switches are switched on in the first mode.

4. The comparing circuit according to claim 1, wherein when the comparing circuit is in a second mode,
   the control terminal of the first coupling transistor is electrically connected to the second terminal;
   the control terminal of the second coupling transistor is electrically connected to the first terminal;
   the second terminal of the third coupling transistor is electrically connected to the second terminal; and
   the second terminal of the fourth coupling transistor is electrically connected to the first terminal.

5. The comparing circuit according to claim 4, wherein the coupling module further comprises:
   a fifth switch electrically connected to the second terminal of the third coupling transistor and the second terminal;
   a sixth switch electrically connected to the second terminal of the fourth coupling transistor and the first terminal;
   a seventh switch electrically connected to the control terminal of the first coupling transistor and the second terminal; and
   an eighth switch electrically connected to the control terminal of the second coupling transistor and the first terminal,
   wherein the fifth, the sixth, the seventh, and the eighth switches are switched on in the second mode.

6. The comparing circuit according to claim 1, wherein the first terminal of each of the coupling transistors is electrically connected to a supply voltage.

7. The comparing circuit according to claim 1, further comprising:
   a current mirror circuit, comprising:
      a reference source transistor, electrically connected to the first external transistor; and
      a mirror transistor, electrically connected to the second external transistor.

8. The comparing circuit according to claim 7, wherein the mirror transistor generates an output signal, the output signal being at a first level in the first mode, and being at a second level different from the first level in the second mode.

9. The comparing circuit according to claim 1, further comprising:
   a current source, electrically connected to the first input transistor and the second input transistor, configured for providing a total current to the first input transistor and the second input transistor.

10. The comparing circuit according to claim 9, wherein when the first input transistor and the second input transistor are conducted, the total current is the sum of a first current flowing through the first input transistor and a second current flowing through the second input transistor.

11. The comparing circuit according to claim 9, wherein when the first input transistor is conducted and the second input transistor is non-conducted, the total current is equivalent to a first current flowing through the first input transistor.

12. The comparing circuit according to claim 1, wherein the coupling module further comprises:
   a switch circuit, electrically connected to the first terminal, the second terminal and the coupling transistors, configured for receiving a first control signal and a second control signal,
   wherein the switch circuit selectively conducts the first terminal to the control terminal of the first coupling transistor, the control terminal of the second coupling terminal, the second terminal of the third coupling transistor and the second terminal of the fourth coupling transistor according to the control signals,
   wherein the switch circuit selectively conducts the second terminal to the control terminal of the first coupling transistor, the control terminal of the second coupling terminal, the second terminal of the third coupling transistor, and the second terminal of the fourth coupling transistor according to the control signals.

13. The comparing circuit according to claim 12, wherein the first control signal and an output signal are in phase, and the second control signal and the output signal are in antiphase.

14. The comparing circuit according to claim 1, wherein a first current amplification factor of the first coupling transistor is equivalent to a second current amplification factor of the second coupling transistor.

15. The comparing circuit according to claim 1, wherein a third current amplification factor of the third coupling transistor is equivalent to a fourth current amplification factor of the fourth coupling transistor.

16. The comparing circuit according to claim 1, wherein a third current amplification factor of the third coupling transistor is greater than a first current amplification factor of the first coupling transistor.

17. The comparing circuit according to claim 1, wherein the first input transistor and the second input transistor are NMOS transistors, and the first external transistor, the second external transistor, and the coupling transistors are PMOS transistors.

18. A comparing module with hysteresis, comprising:
   a first resistor having a first resistance for receiving an input voltage;
   a second resistor having a second resistance and electrically connected to the first resistor, configured for receiving a ground voltage, wherein a comparison voltage is determined according to the input voltage, the first resistance of the first resistor and the second resistance of the second resistor; and
   a comparing circuit, comprising:
      an input circuit, comprising:
         a first input transistor, configured for receiving a reference voltage; and
         a second input transistor, configured for receiving the comparison voltage;

an external circuit, comprising:
- a first external transistor, electrically connected to the first input transistor through a first terminal; and
- a second external transistor, electrically connected to the second input transistor through a second terminal; and a coupling module, comprising:
- a first current amplification circuit, comprising:
  - a first coupling transistor having a first terminal, a second terminal and a control terminal, wherein the second terminal of the first coupling transistor is electrically connected to the first terminal, and the control terminal of the first coupling transistor is selectively electrically connected to either one of the first terminal and the second terminal; and
  - a second coupling transistor having a first terminal, a second terminal and a control terminal, wherein the second terminal of the second coupling transistor is electrically connected to the second terminal, and the control terminal of the second coupling transistor is selectively electrically connected to either one of the first terminal and the second terminal; and
- a second current amplification circuit, comprising:
  - a third coupling transistor having a first terminal, a second terminal and a control terminal, wherein the second terminal of the third coupling transistor is selectively electrically connected to either one of the first terminal and the second terminal, and the control terminal of the third coupling transistor is electrically connected to the second terminal; and
  - a fourth coupling transistor having a first terminal, a second terminal and a control terminal, wherein the second terminal of the fourth coupling transistor is selectively electrically connected to either one of the first terminal and the second terminal, and the control terminal of the fourth coupling transistor is electrically connected to the first terminal.

19. The comparing module according to claim 18, wherein the coupling module further comprises:
- a first inverter, electrically connected to the comparing circuit, configured for receiving an output signal and generating a first control signal, wherein the output signal and the first control signal being in antiphase; and
- a second inverter, electrically connected to the first inverter and the comparing circuit, configured for receiving the first control signal and generating a second control signal, wherein the output signal and the second control signal are in phase.

20. The comparing module according to claim 18, further comprising:
- a first switch, electrically connected to the second terminal of the third coupling transistor and the first terminal;
- a second switch, electrically connected to the second terminal of the fourth coupling transistor and the second terminal;
- a third switch, electrically connected to the control terminal of the first coupling transistor and the first terminal;
- a fourth switch, electrically connected to the control terminal of the second coupling transistor and the second terminal,
- a fifth switch, electrically connected to the second terminal of the third coupling transistor and the second terminal;
- a sixth switch, electrically connected to the second terminal of the fourth coupling transistor and the first terminal;
- a seventh switch, electrically connected to the control terminal of the first coupling transistor and the second terminal; and
- an eighth switch, electrically connected to the control terminal of the second coupling transistor and the first terminal,
- wherein in a first mode, the first, the second, the third, and the fourth switches are switched on, and the fifth, the sixth, the seventh, and the eighth switches are switched off,
- wherein in a second mode, the first, the second, the third, and the fourth switches are switched off, and the fifth, the sixth, the seventh, and the eighth switches are switched on.

* * * * *